US012671335B2

(12) United States Patent
Shah et al.

(10) Patent No.: US 12,671,335 B2
(45) Date of Patent: Jun. 30, 2026

(54) COMPARATOR WITH NOISE CANCELLATION FOR SWITCHING POWER CONVERTERS

(71) Applicant: Texas Instruments Incorporated, Dallas, TX (US)

(72) Inventors: Yash Shah, Mumbai (IN); Dattatreya Baragur Suryanarayana, Bangalore-Bagmane Lakeview (IN); Bikash Pradhan, Bangalore-Bagmane Lakeview (IN); Mayank Jain, Kodihalli Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 228 days.

(21) Appl. No.: 18/673,633

(22) Filed: May 24, 2024

(65) Prior Publication Data

US 2025/0096680 A1 Mar. 20, 2025

(30) Foreign Application Priority Data

Sep. 20, 2023 (IN) ............................. 202341063073

(51) Int. Cl.
| | |
|---|---|
| *H02M 3/158* | (2006.01) |
| *H02M 3/08* | (2006.01) |
| *H03K 5/24* | (2006.01) |

(52) U.S. Cl.
CPC .......... *H02M 3/158* (2013.01); *H03K 5/2481* (2013.01)

(58) Field of Classification Search
CPC ...................................................... H02M 1/08
See application file for complete search history.

(56) References Cited

U.S. PATENT DOCUMENTS

| | | | | |
|---|---|---|---|---|
| 10,110,221 | B1 | 10/2018 | Sharma et al. | |
| 12,381,483 | B2 * | 8/2025 | Liang ....................... | H02M 1/36 |
| 2015/0077081 | A1 | 3/2015 | Ejury et al. | |
| 2020/0072878 | A1 * | 3/2020 | Pollak .............. | G01R 19/16528 |
| 2020/0381989 | A1 * | 12/2020 | Kuang ............. | H03K 19/01714 |
| 2024/0106318 | A1 * | 3/2024 | Kwak ..................... | H02M 1/08 |

(Continued)

OTHER PUBLICATIONS

Glaser, Chris, " Understanding 100% mode in low-power DC/DC converters," Analog Design Journal, Texas Instruments (2018). 6 pages.

(Continued)

*Primary Examiner* — Sisay G Tiku
(74) *Attorney, Agent, or Firm* — Frank D. Cimino

(57) ABSTRACT

Comparator circuitry for power converters. In an example, a circuit includes a comparator having a first comparator input, a second comparator input, and a comparator output, the comparator coupled to a supply terminal. The circuit further includes a first transistor coupled between a boot terminal and the first comparator input and having a control terminal coupled to a switching terminal, and a second transistor coupled between the boot terminal and the second comparator input and having a control terminal coupled to the switching terminal. Also, a third transistor is coupled between the supply terminal and the second comparator input, and a voltage reference generator is coupled to the supply terminal and to a control terminal of the third transistor.

20 Claims, 5 Drawing Sheets

(56) References Cited

U.S. PATENT DOCUMENTS

2024/0231403 A1 *  7/2024  Jing ...................... H02H 9/025
2025/0088104 A1 *  3/2025  Rossi ................... H02M 1/088
2025/0309752 A1 * 10/2025  Olivares ............... H02M 1/32
2026/0018997 A1 *  1/2026  Fukushima ........... H02M 3/157

OTHER PUBLICATIONS

Partial Search Report mailed Jan. 3, 2025, PCT Application No. PCT/2024/046846, 4 pages.

* cited by examiner

COMPARATOR WITH NOISE CANCELLATION FOR SWITCHING POWER CONVERTERS

TECHNICAL FIELD

This description relates to power converters and to techniques for reducing noise in comparator circuits used in power converters.

BACKGROUND

A metal oxide semiconductor field effect transistor (MOSFET) device can be used as a switch when operated in its triode/linear region because it exhibits low ON resistance in this region of operation. N-channel MOSFETs typically have better mobility than their comparable P-channel counterparts and therefore can be a preferred choice for use as a switch. Accordingly, in applications such as DC-DC converters, N-channel MOSFETs are widely used as switches. However, if an N-channel MOSFET is used as a high-side transistor, a gate voltage greater than the supply voltage ($V_{DD}$) may be needed for the device to be fully turned-on. In some DC-DC converter configurations, such as a half-bridge configuration, a high input voltage level may prohibit the use of a direct gate-drive circuit for a high-side N-channel power MOSFET. Therefore, a bootstrap gate driver circuit may be used as follows. When the low-side MOSFET is turned on, the switching terminal pulls to ground, and a bootstrap capacitor is charged through a bootstrap resistor and bootstrap diode from the $V_{DD}$ power supply. When the low-side MOSFET turns off, the energy stored in the bootstrap capacitor becomes a floating bias for the high-side driving circuit to turn on the high-side MOSFET. Non-trivial issues remain with respect to accurately monitoring the boot voltage in DC-DC power converters using bootstrap gate drivers.

SUMMARY

According to one example, a circuit comprises a comparator having a first comparator input, a second comparator input, and a comparator output, the comparator coupled to a supply terminal, a first transistor coupled between a boot terminal and the first comparator input, and having a control terminal coupled to a switching terminal, a second transistor coupled between the boot terminal and the second comparator input, and having a control terminal coupled to the switching terminal, a third transistor coupled between the supply terminal and the second comparator input, and a voltage reference generator coupled to the supply terminal and to a control terminal of the third transistor.

According to another example, a circuit comprises a comparator having a first comparator input, a second comparator input, and a comparator output, the comparator coupled to a supply terminal, and first circuitry coupled to a boot terminal and to a switching terminal, the first circuitry configured to produce, at the first comparator input, a first voltage signal proportional to a difference between a boot voltage at the boot terminal and a switching voltage at the switching terminal, the first voltage signal including a first noise component. The circuit further comprises second circuitry coupled to the supply terminal and configured to produce, at the second comparator input, a second voltage signal, and noise cancellation circuitry coupled to the boot terminal, the switching terminal, and the second circuitry, the noise cancellation circuitry configured to introduce into the second voltage signal a second noise component substantially matching the first noise component, wherein the comparator is configured to produce, at the comparator output, an output signal that transitions from a first value to a second value responsive to the first voltage signal transgressing a threshold value based on the second voltage signal.

According to another example, a buck converter comprises a first transistor coupled between an input voltage terminal and a switching terminal, a second transistor coupled between the switching terminal and a ground terminal, a driver coupled to a boot terminal and the switching terminal, and having a driver output coupled to a control terminal of the first transistor, the driver configured to provide a drive signal at the control terminal of the first transistor, and a boot comparator system configured to monitor a boot voltage at the boot terminal. The boot comparator system includes a comparator having a first comparator input, a second comparator input, and a comparator output, the comparator coupled to a supply terminal, a first transistor coupled between the boot terminal and the first comparator input, and having a control terminal coupled to the switching terminal, a second transistor coupled between the boot terminal and the second comparator input, and having a control terminal coupled to the switching terminal, a third transistor coupled between the supply terminal and the second comparator input, and a voltage reference generator coupled to the supply terminal and to a control terminal of the third transistor.

DETAILED DESCRIPTION

Figure 1:
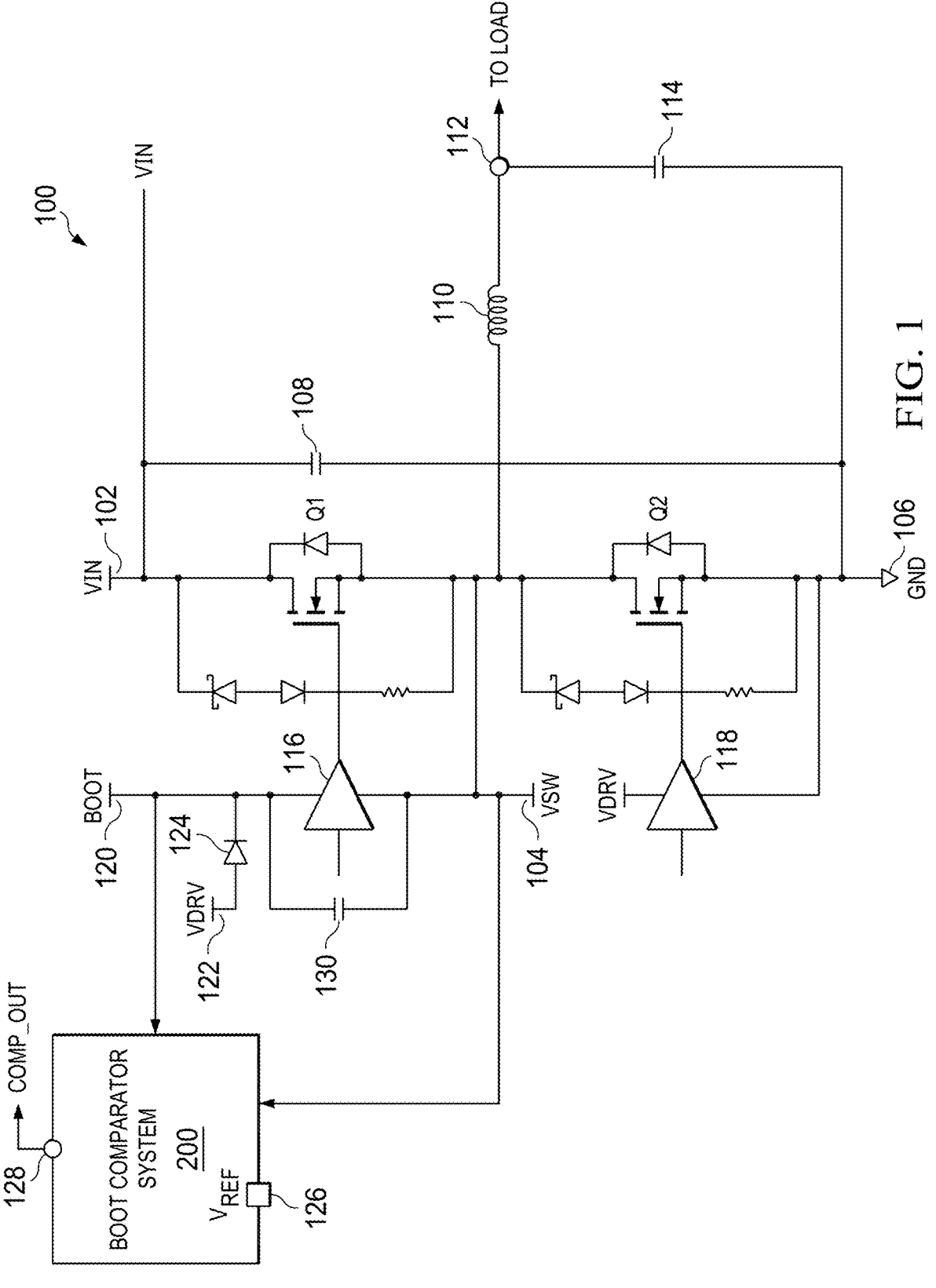
FIG. 1 is a diagram of a switching power converter including a boot comparator system according to certain examples.

Techniques are described for noise cancellation in comparator circuitry for power converter applications. The techniques described herein may be used in a variety of circuits and systems, including DC-DC switching power converters, such as buck converters, for example. In certain examples, the techniques can be applied in a boot comparator system of a buck converter (or other type of DC-DC power converter) to monitor the boot capacitor voltage. As described in more detail below, the boot comparator system may include a comparator that compares the difference between the boot capacitor voltage and the switching terminal voltage against a reference threshold value. The boot comparator system may further include noise cancellation circuitry to prevent or reduce false triggering of the comparator. In one such example system, a circuit comprises a comparator having a first comparator input, a second comparator input, and a comparator output, the comparator coupled to a supply terminal. A first transistor is coupled between a boot terminal and the first comparator input, and has a control terminal coupled to a switching terminal. Also, a second transistor is coupled between the boot terminal and the second comparator input, and has a control terminal coupled to the switching terminal, and a third transistor is coupled between the supply terminal and the second comparator input. The circuit may further comprise a voltage reference generator coupled to the supply terminal and to a control terminal of the third transistor. These and other aspects are described in more detail below.

General Overview

As noted above, some DC-DC converters that use one or more N-channel MOSFETs as the high-side switching/power transistor(s) may include a bootstrap gate driver to provide a gate voltage greater than the supply voltage so to fully turn on the high-side switching transistor(s). In some applications, an under-voltage lock-out (UVLO) circuit may be used to turn off power to the DC-DC converter, thereby preventing unpredictable and/or potentially damaging operation of the converter, when the boot voltage across the bootstrap capacitor is too low. In particular, the UVLO circuit may prevent operation of the DC-DC converter if the difference between the boot voltage across the bootstrap capacitor and a voltage at a switching terminal of the DC-DC converter is insufficient for the high-side circuitry to work properly. Accordingly, the UVLO circuit may include, or be coupled to, a comparator that compares the boot voltage ($V_{BOOT}$) and the voltage at the switching terminal ($V_{SW}$) to provide a digital output that indicates when the difference between these two voltages has crossed a threshold value ($V_{THRESH}$). This comparison, however, can be challenging. In more detail, in various DC-DC converters, the high-side and low-side transistors are switched according to pulse width modulation (PWM) control signals. During PWM switching, the voltage at the switching terminal, $V_{SW}$, may have very high transient (e.g., $\delta V/\delta t$) values, for example approximately 10V per nanosecond (ns), which can inject noise into the comparator input and significantly affect operation of the comparator. For example, this switching noise can cause false triggering of the comparator, which in turn can cause the UVLO circuit improperly shut down operation of the DC-DC converter. In addition, high frequency (e.g., on the order of a few hundred MHz) can be present due to parasitics within the circuitry. One possible approach to mitigating the problem of switching noise is to place the comparator circuit entirely between the high-side voltage rails, namely, $V_{BOOT}$ and $V_{SW}$, and then use level shifters to shift the comparator output signal down into the low-voltage supply ($V_{DD}$) domain for subsequent processing (e.g., by the UVLO circuitry). However, these level shifters must be capable of accepting relatively high input voltages (e.g., 20V or 25V) and also consume relatively high current from the boot voltage ($V_{BOOT}$) for faster operation. As a result, they can occupy significant die area. Furthermore, at least one level shifter is used for each comparator output. Thus, a circuit that include N comparator outputs, also includes N level shifters, which may result in very large die area being used and high associated cost.

Accordingly, techniques described herein may provide a boot comparator system that is at least partially immune to the switching noise injected due to PWM switching, and that can provide robust, accurate operation even in the presence of switching and other noise. As described further below, certain examples of the boot comparator system include circuitry that translates the high-side voltage signal information into a current, thereby allowing the comparison to be performed entirely in the low-voltage $V_{DD}$ domain. This approach may avoid the use of multiple level shifters, thus achieving significant savings in terms of die area occupied by the boot comparator system. The boot comparator system according to certain examples may include a measurement branch that receives signals representative of the boot voltage, $V_{BOOT}$, and the switching voltage, $V_{SW}$, and a reference branch that produces a reference signal representative of the threshold value, $V_{THRESH}$, against which the difference between the $V_{BOOT}$, and the switching voltage, $V_{SW}$, can be compared. The above-described switching noise may be injected into the measurement branch of the circuitry because of coupling due to parasitic capacitance in the circuitry. Accordingly, in some examples, the circuitry is configured to inject substantially the same amount of noise into the reference branch such that, differentially, the comparator does not see a noise delta between its two input signals. As a result, false triggering of the comparator due to switching noise can be reduced or eliminated. In some examples, the circuitry can be implemented with relatively low-area components (particularly as compared to the level shifters used in some other approaches) and consumes low quiescent current from the high-side supply rail. In addition, in some examples, because an internal (e.g., on-chip) reference voltage can be used to produce the threshold value, $V_{THRESH}$, the circuitry may have good accuracy for the comparator thresholds. Thus, a boot comparator system is provided that may achieve more accurate and robust operation with lower die area.

Example Circuitry

FIG. 1 is a diagram illustrating an example of a switching power converter 100 including a boot comparator system 200 according to certain aspects. In the illustrated example, the switching power converter 100 is configured as a DC-DC buck converter and includes a high-side transistor Q1 and a low-side transistor Q2. The high-side transistor Q1 is coupled between an input voltage terminal 102 and a switching terminal 104. The low-side transistor Q2 is coupled between the switching terminal 104 and a ground terminal 106, which for convenience of description is referred to herein as a ground terminal. An input capacitor 108 may be coupled between the input voltage terminal 102 and the ground terminal 106. In some examples, an inductor 110 is coupled between the switching terminal 104 and an output terminal 112, to which an external load may be coupled. An output capacitor 114 may be coupled between the output terminal 112 and the ground terminal 106. The power converter 100 may receive an input voltage, $V_{IN}$, at the input voltage terminal 102 and a provide a regulated output voltage, VOUT, at the output terminal 112.

As described above, in some examples, the high-side transistor Q1 is an N-channel MOSFET. In the example illustrated in FIG. 1, the high-side transistor Q1 is an N-channel, three terminal enhancement-mode MOSFET having a drain terminal coupled to the input voltage terminal 102 and a source terminal coupled to the switching terminal 104. A high-side gate driver 116 is coupled to a gate control terminal of the high-side transistor Q1, and receives a drive supply voltage, $V_{DRV}$. Similarly, in the example of FIG. 1, the low-side transistor Q2 is an N-channel, three terminal enhancement-mode MOSFET having a drain terminal coupled to the switching terminal 104 and a source terminal coupled to the ground terminal 106. A low-side gate driver 118 is coupled to a gate control terminal of the low-side transistor Q1, and receives the drive supply signal, $V_{DRV}$.

As described above, the high-side gate driver 116 may be implemented as a bootstrap gate driver. Accordingly, the switching power converter 100 may include a bootstrap capacitor 130 coupled across the high-side gate driver 116 between a boot terminal 120 and the switching terminal 104, as shown in FIG. 1. As used herein, the boot terminal 120 refers to a terminal at which the voltage across the bootstrap capacitor 130 ($V_{BOOT}$) can be sensed or measured. In the illustrated example, the boot terminal 120 and the switching terminal 104 provide supply rails for operation of the high-side gate driver 116. In some examples, a drive supply terminal 122, at which the drive supply signal, $V_{DRV}$, is received is coupled to the boot terminal 120 via a diode 124.

As illustrated in FIG. 1, the boot comparator system 200 may be coupled to the boot terminal 120 to detect the boot voltage, $V_{BOOT}$, and to the switching terminal 104 to detect the switching voltage, $V_{SW}$. The boot comparator system 200 includes a reference terminal 126 at which a reference voltage, $V_{REF}$, is produced, as described further below. In some examples, the reference terminal 126 is internal to the boot comparator system 200; however, in other examples, the reference terminal 126 may couple to an external voltage source. The boot comparator system 200 further includes an output terminal 128 at which a comparator output signal, COMP_OUT, may be provided. In some examples, the comparator output signal, COMP_OUT, is a digital signal indicating whether or not the difference between the boot voltage, $V_{BOOT}$, and the switching voltage, $V_{SW}$, has crossed the threshold value, $V_{THRESH}$, represented by the reference voltage, $V_{REF}$. In some instances, when the difference between the boot voltage, $V_{BOOT}$, and the switching voltage, $V_{SW}$, is below the threshold value, $V_{THRESH}$, this may indicate that the boot voltage, $V_{BOOT}$, is below the level needed for the high-side circuitry to work properly, as described above. Accordingly, the output terminal 128 may be coupled to UVLO circuitry, for example, that, as described above, can be used to turn off power to the switching power converter 100 (thereby preventing unpredictable and/or potentially damaging operation of the converter), when the comparator output signal, COMP_OUT, indicates that the boot voltage, $V_{BOOT}$, is too low.

The power converter 100 and the boot comparator system 200 thereof can be implemented, in whole or in part, using integrated circuits (ICs). In one example, the high-side and low-side transistors Q1 and Q2, the high-side and low-side gate drivers 116, 118, and the boot comparator system 200 are formed in a single IC (not shown). In various alternative implementations, one or more components of these circuits can be implemented outside of the IC. Moreover, one or more system components, such as the inductor 110, for example, can be provided "off-chip" and coupled to the IC.

Figure 2:
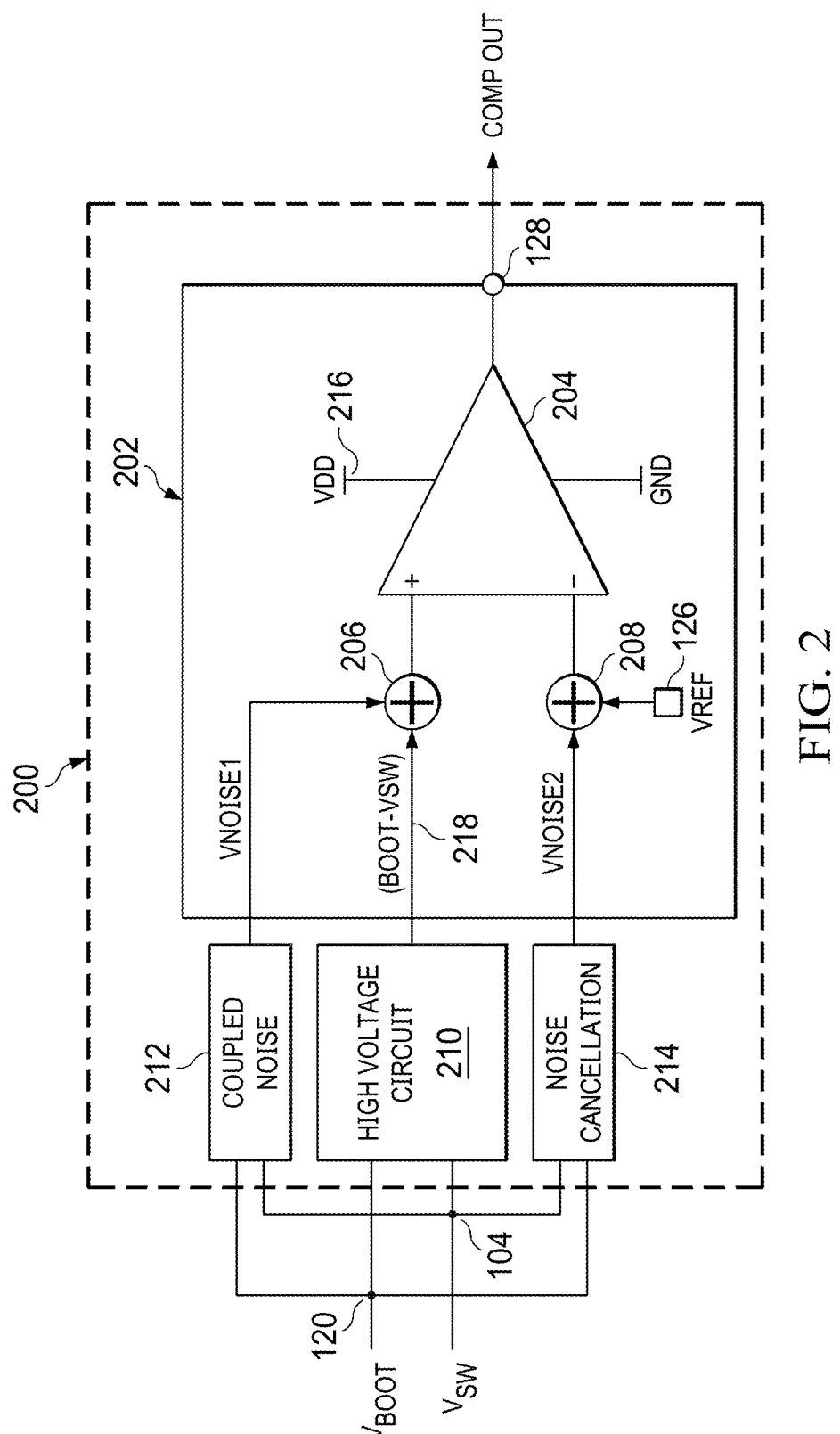
FIG. 2 is a block diagram of the boot comparator system of FIG. 1, in an example.
Figure 5B:
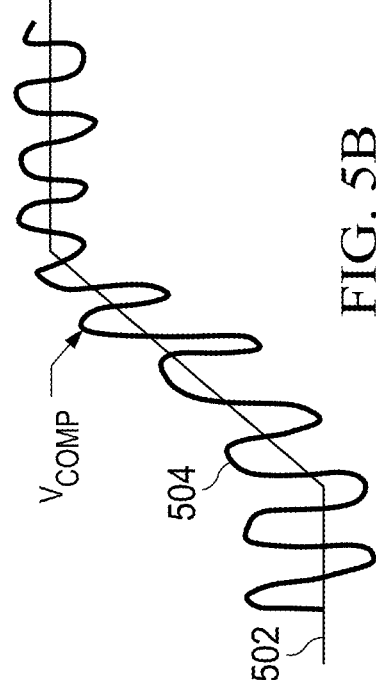
FIG. 5B is a graph illustrating a measurement voltage in the circuit of FIG. 3 or 4, in an example.
Figure 5C:
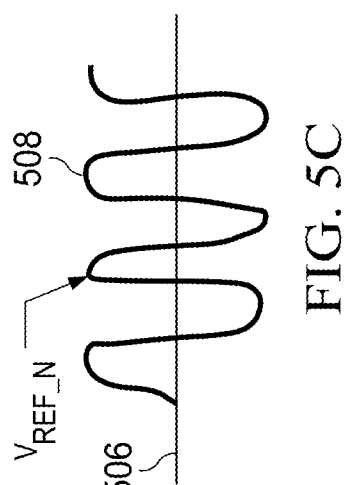
FIG. 5C is a graph illustrating a reference voltage in the circuit of FIG. 3 or 4, in an example.
Figure 5A:
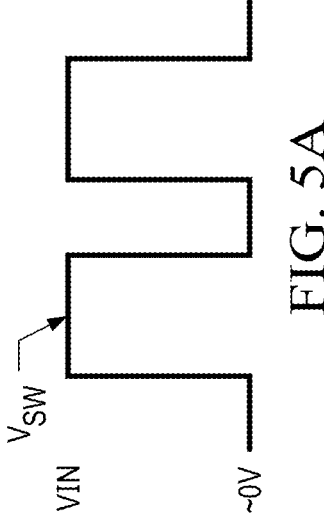
FIG. 5A is a graph illustrating a switching voltage in the circuit of FIG. 3 or 4, in an example.

Referring to FIG. 2, there is illustrated a block diagram of the boot comparator system 200 according to certain examples. The boot comparator system 200 includes a comparator circuit 202. In some examples, the comparator circuit 202 includes a comparator 204 (which may be a hysteretic comparator) that produces the comparator output signal, COMP_OUT, at the output terminal 128 based on differences between the signals at its two input terminals (labeled "+" and "−"). The boot comparator system 200 may include a high-voltage circuit 210 that is coupled to the boot terminal 120 and to the switching terminal 104 to receive the boot voltage, $V_{BOOT}$, and the switching voltage, $V_{SW}$, respectively. In some examples, the power converter 100 may operate with a relatively high input voltage, $V_{IN}$, for example approximately 20V (e.g., in a range of about 18V-22V, or 20V±10%). Accordingly, the switching voltage, $V_{SW}$, may also be a relatively high voltage, transitioning between the voltage at the ground terminal 106 (e.g., approximately 0V) and the input voltage, $V_{IN}$. For example, the switching voltage, $V_{SW}$, may be a square-wave or pulse signal (e.g., as shown in FIG. 5A), transitioning between these two levels. As described above, to fully turn on the high-side transistor Q1, the boot voltage, $V_{BOOT}$, may need to exceed the input voltage, $V_{IN}$, and thus, in some examples, may be as high as approximately 25V. For example, the boot voltage, $V_{BOOT}$, may exceed the input voltage, $V_{IN}$, by one transistor gate-source voltage (Vgs). Accordingly, the high-voltage circuit 210 receives these potentially high voltage input signals ($V_{SW}$ and $V_{BOOT}$) and produces a differential signal 218 in the low-voltage $V_{DD}$ domain, as described further below. Accordingly, as shown in FIG. 2, the comparator 204 may operate using a low-voltage supply, $V_{DD}$, and may thus be coupled between a supply voltage terminal 216 (to receive the supply voltage $V_{DD}$) and a ground terminal, GND. In some examples, the differential signal 218 represents the difference between the boot voltage, $V_{BOOT}$, and the switching voltage, $V_{SW}$. For example, the differential signal 218 may be proportional to the difference between the boot voltage, $V_{BOOT}$, and the switching voltage, $V_{SW}$.

As described above, during switching of the high-side and low-side transistors Q1 and Q2, switching noise can be coupled into the switching voltage, $V_{SW}$, and into the boot voltage, $V_{BOOT}$, as represented by block 212 in FIG. 2. Accordingly, the signal at a first input of the comparator 204 (labeled "+") may be a superposition (represented by summation block 206) of the differential signal 218 and the coupled noise, Vnoise1. According to certain examples, the boot comparator system 200 includes noise cancellation circuitry 214 that injects a noise signal, Vnoise2, into the reference voltage signal, $V_{REF}$, received at the reference terminal 126. Accordingly, the signal at a second input of the comparator 204 (labeled "−") is a superposition (represented by summation block 208) of the reference voltage signal, $V_{REF}$, and the injected noise signal, Vnoise2. In some examples, the injected noise signal, Vnoise2, is substantially the same as (e.g., within a tolerance of 5% or less) the coupled noise signal, Vnoise1. As a result, because the same noise is present at both comparator inputs, the comparator 204 does not respond to the noise and instead triggers based on the difference between the differential signal 218 and the reference voltage, $V_{REF}$, and produces the output signal, COMP_OUT. Accordingly, false triggers due to the switching noise can be reduced or eliminated. In some examples, at least some components of the noise cancellation circuitry 214 may be part of the high-voltage circuit 210, as described further below.

Figure 3:
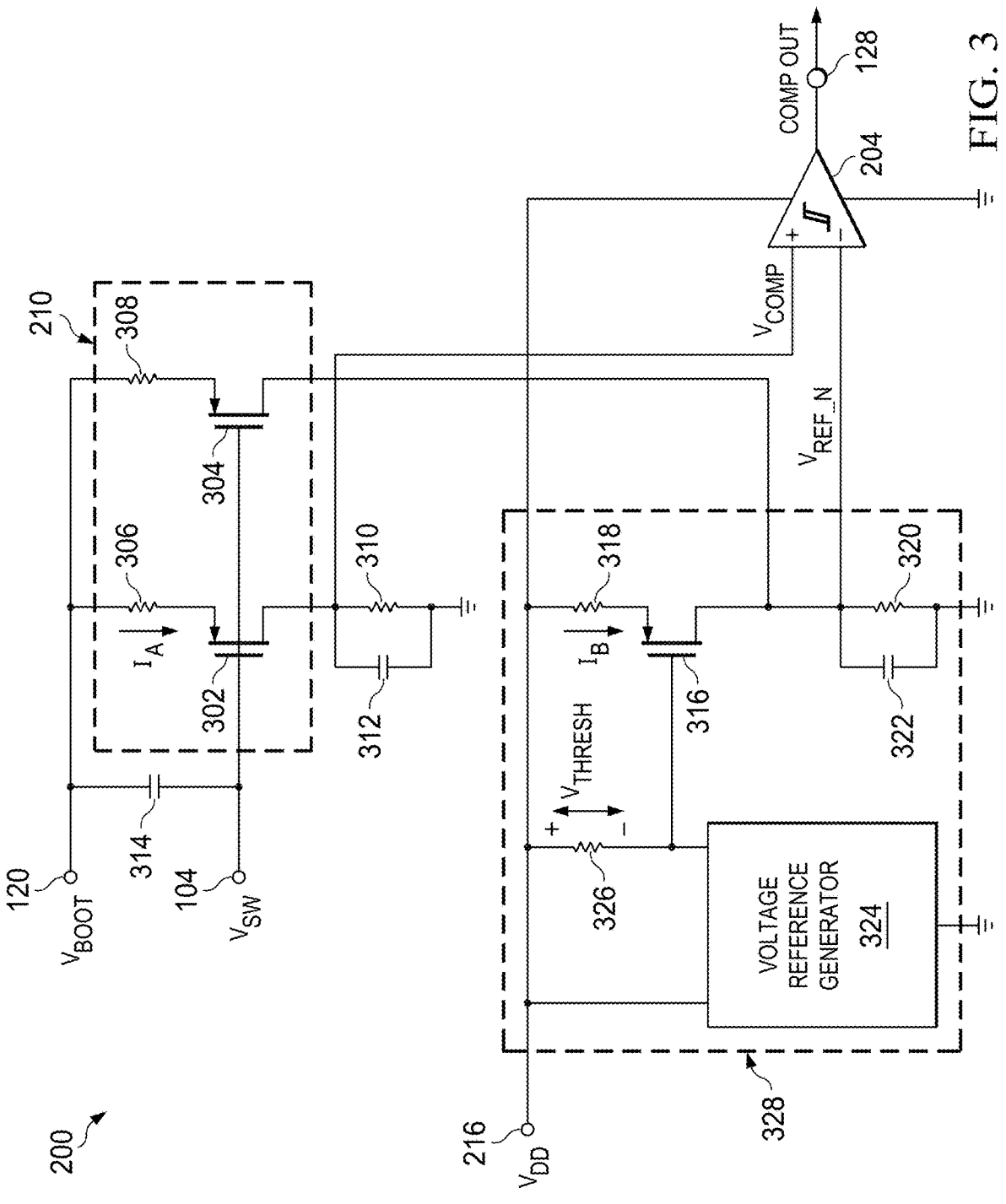
FIG. 3 is a circuit diagram of the boot comparator system of FIG. 2, in an example.

Referring to FIG. 3, there is illustrated a circuit diagram of an example of the boot comparator system 200. In this example, the high-voltage circuit 210 includes first and second transistors 302, 304 coupled to the boot terminal 120 and to the switching terminal 104, as shown. In some examples, the first and second transistors 302, 304 are relatively high-voltage (e.g., 30V) drain-extended P-channel MOSFETs.

In some examples, the first transistor 302 has a source terminal coupled via a first source resistor 306 to the boot terminal 120, a drain terminal coupled to the first input of the comparator 204, and a gate control terminal coupled to the switching terminal 104. A first sense resistor 310 may be coupled between the drain terminal of the first transistor 302 (and the first input of the comparator 204) and a ground terminal. An input capacitor 314 may be coupled between the boot terminal 120 and the switching terminal 104, as shown. A capacitor 312 may be coupled across (in parallel with) the first sense resistor 310 between the drain terminal of the first transistor 302 and the ground terminal. The first transistor 302 and the first source resistor 306 may form part of the measurement branch of the boot comparator system 200. The second transistor 304 may have a source terminal coupled via a second source resistor 308 to the boot terminal 120, and a gate control terminal coupled to the switching terminal 104. The second transistor 304 and second source resistor 308 may be part of the noise cancellation circuitry 214 described further below.

In operation, the first transistor 302 translates the differential voltage between the boot voltage, $V_{BOOT}$, and the switching voltage, $V_{SW}$, (including the superimposed coupled noise signal, Vnoise1) into a current, $I_A$, that in turn is converted back into a voltage across the first sense resistor 310. This voltage, $V_{COMP}$, is a low voltage signal that is input to the comparator 204, as shown. Thus, the high-voltage circuit 210 operates as an interface between the high-voltage domain of the boot and switching voltages, $V_{BOOT}$ and $V_{SW}$ and the low-voltage, $V_{DD}$, domain of the comparator 204. Signal information from the high-side domain is translated into the current, $I_A$, which on passing through the first sense resistor 310, generates the voltage, $V_{COMP}$, containing the signal information. This translation from high voltage to low voltage can be achieved without the use of level shifters, which as noted above, can consume high current and occupy large volume. In contrast, the transistors 302, 304 may occupy comparatively little volume and draw comparatively low quiescent current. In certain examples, the quiescent current drawn by the boot comparator system 200 can be controlled through selection of the value of the first and second source resistors 306, 308.

The boot comparator system 200 may further include reference branch circuitry 328 for generating the reference voltage, $V_{REF}$. In some examples, this reference branch circuitry 328 operates entirely within the low-voltage (e.g., $V_{DD}$) domain. According to certain examples, the reference voltage, $V_{REF}$, is generated across a second sense resistor 320. In some examples, the boot comparator system 200 includes a voltage reference generator 324 coupled to the supply voltage terminal 216 for the comparator 204. The voltage reference generator 324 is configured to produce the threshold voltage, $V_{THRESH}$, across a resistor 326. The corresponding reference voltage, $V_{REF}$, is generated, based on the threshold voltage, $V_{THRESH}$, across the second sense resistor 320.

In some examples, the boot comparator system 200 includes a third transistor 316 coupled between the supply voltage terminal 216 and the ground terminal, as shown. The third transistor 316 may the same as the first transistor 302 (e.g., same type, same size, and same configuration). Accordingly, in some examples, the third transistor 316 is a relatively high-voltage (e.g., 30V) drain-extended PMOS device having a source terminal coupled to supply voltage terminal 216 via a third source resistor 318. The third transistor 316 further has a drain terminal coupled to a drain terminal of the second transistor 304 and to the second input of the comparator 204, and a gate control terminal coupled to the voltage reference generator 324. Thus, the second sense resistor 320 is coupled between the drain terminal of the third transistor 316 and the ground terminal. A capacitor 322 may be coupled in parallel with the second sense resistor 320 between the drain terminal of the third transistor 316 and the ground terminal. In some examples, the resistor 326 (across which the threshold voltage, $V_{THRESH}$, is produced)

is coupled between the supply voltage terminal 216 and the gate control terminal of the third transistor 316.

In operation, the third transistor 316 may generate a current, $I_B$, based on the threshold voltage, $V_{THRESH}$. This current, $I_B$, is converted into the reference voltage, $V_{REF}$, across the second sense resistor 320. In certain examples, for proper operation of the boot comparator system 200, the first source resistor 306 is matched to the third source resistor 318, the first sense resistor 310 is matched to the second sense resistor 320, and the first and third transistors 302, 316 are the same, as described above. For example, to be matched, the first and third source resistors 306, 318 may have substantially the same resistance value (e.g., within a tolerance of 5%), and the first and second sense resistors may have substantially the same resistance value (e.g., within a tolerance of 5%). Similarly, in some examples, the two capacitors 312, 322 have substantially the same capacitance values (e.g., within a tolerance of 5% or less). Thus, in operation, the comparator 204 receives at its inputs, the measurement signal, $V_{COMP}$, that is representative of the differential signal 218, and a reference signal, $V_{REF\_N}$, that is representative of the reference voltage, $V_{REF}$, and therefore of the threshold voltage, $V_{THRESH}$. Accordingly, the comparator causes the output signal, COMP_OUT, to change state (e.g., transition from high to low or low to high) when the difference signal crosses the threshold value, $V_{THRESH}$. It will be appreciated that the reference voltage, $V_{REF}$, used in the comparison may differ slightly from the threshold value, $V_{THRESH}$, (e.g., by at least a voltage step across the third transistor 316). Accordingly, to have the comparator 204 trigger at the correct level, the voltage reference generator 324 can be configured to produce the threshold voltage, $V_{THRESH}$, with a value that accounts for the voltage difference with the reference voltage, $V_{REF}$.

Figure 4:
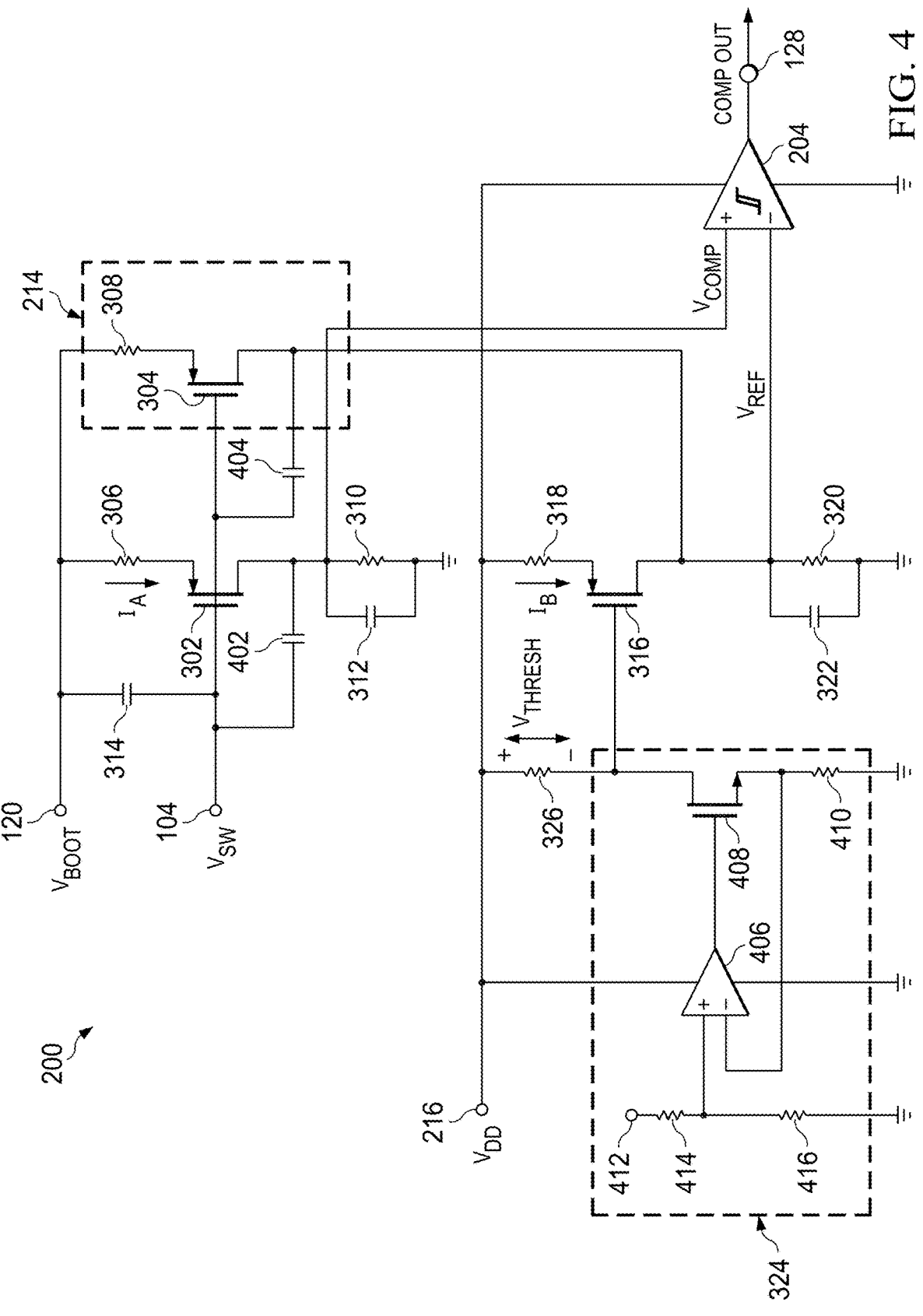
FIG. 4 is a circuit diagram of the boot comparator system of FIG. 2, in another example.

As described above, the measurement signal, $V_{COMP}$, includes the coupled noise, Vnoise1. Accordingly, the noise cancellation circuitry 214 may operate to injects the same amount of noise (Vnoise2) into the reference voltage, $V_{REF}$, as is present in the measurement signal, $V_{COMP}$, (Vnoise1). As described above, and as illustrated in FIG. 5A, during switching of the transistors Q1 and Q2, the switching voltage, $V_{SW}$, can switch between approximately 0V and $V_{IN}$, or possibly a few volts higher than $V_{IN}$ due to ringing, with potentially very high transients (e.g., ~10V/ns). Referring to FIG. 4, due to parasitic capacitance 402 of the first transistor 302, switching noise can be coupled into the voltage across the first sense resistor 310. Thus, referring to FIG. 5B, the measurement signal, $V_{COMP}$, at the first comparator input includes a component 502 that is representative of the differential signal 218 (the difference between the boot voltage, $V_{BOOT}$, and the switching voltage, $V_{SW}$) along with a first noise component 504 (e.g., Vnoise1).

Referring again to FIG. 4, by adding the noise cancellation circuitry 214, the same switching noise can be coupled into the reference voltage, $V_{REF}$, generated across the second sense resistor 320 due to parasitic capacitance 404 of the second transistor 304. As described above, in some examples, the second transistor 304 has a source terminal coupled to the boot terminal 120 via the second source resistor 308, and a gate control terminal coupled to the switching terminal 104. The drain terminal of the second transistor 304 may be coupled to the drain terminal of the third transistor 316, and to the second sense resistor 320. Thus, the second transistor 304 generates a noise-cancelling current based on the differential signal 218 (in the same manner as described above with reference to operation of the first transistor 302) and the noise coupled into the signal via the parasitic capacitance 404. This noise-cancelling current can be scaled to be a fraction of the corresponding measurement path current generated by the first transistor 302 by scaling the second source resistor 308. For example, the second source resistor 308 may have a resistance value that is several times larger than that of the first source resistor, such that the noise-cancelling current is several times smaller than the measurement current produced by the first transistor 302. In one example, the second source resistor has a resistance value that is substantially N times (e.g., within a tolerance of 5%) the resistance value of the first source resistor 306, with N being a positive value. In some examples, N is an integer value, such as 5, 8, 10, etc. However, in other examples, other scaling factors may be used. As described above, the quiescent current drawn by the boot comparator system 200 may be controlled through selection of the resistance values of the two source resistors 306, 308.

According to certain examples, the noise-cancelling current produced by the second transistor 304 is converted to a voltage across the second sense resistor 320 and thus injected into the reference voltage, $V_{REF}$. Accordingly, referring to FIG. 5C, the reference signal, $V_{REF\_N}$, present at the second input of the comparator 204 includes a reference voltage component 506 corresponding to the reference voltage, $V_{REF}$, and representative of the threshold value, $V_{THRESH}$, along with a second noise component 508 (e.g., Vnoise2). If the first and second transistors 302, 304 are essentially the same (e.g., same channel type, same size, same configuration, etc.), the parasitic capacitances 402, 404 may be essentially the same, and therefore, the injected noise signal Vnoise2 may be essentially the same as the coupled noise signal, Vnoise1. As a result, the noise becomes "common mode" for the comparator 204 and thus may not impact the comparison as there is little to no differential noise seen at the comparator inputs. To the extent that small differences exist between the two noise signals, Vnoise1 and Vnoise2, these differences may be insufficient to cause the comparator output signal, COMP_OUT, to change state. Rather, the comparator 204 triggers based on a difference between the component 502 (representative of the differential signal 218) in the measurement signal, $V_{COMP}$, and the reference voltage component 506 (representative of the threshold value, $V_{THRESH}$) in the reference signal, $V_{REF}$_N. Accordingly, the comparator 204 may operate accurately and robustly even in the presence of the coupled noise 212, triggering as intended, based on the difference between the boot voltage, $V_{BOOT}$, and the switching voltage, $V_{SW}$, crossing the threshold value, $V_{THRESH}$.

FIG. 4 also illustrates an example of the voltage reference generator 324. In this example, the voltage reference generator 324 includes an operational amplifier 406 coupled to the comparator supply voltage terminal 216 (to receive the supply voltage, $V_{DD}$, as an operating supply) and to the ground terminal. The operational amplifier 406 may have a first input (labeled "+") coupled to a reference supply terminal 412 via a resistive divider that includes a first resistor 414 and a second resistor 416 coupled in series between the reference supply terminal 412 and the ground terminal. Thus, the operational amplifier 406 receives at the first input a scaled version of a reference supply voltage, Vrs, at the reference supply terminal 412. The voltage reference generator 324 may further include a transistor 408 having a control terminal coupled to the output of the operational amplifier 406, a first terminal (e.g., a drain terminal) coupled to the resistor 326, and a second terminal (e.g., a source terminal) coupled the ground terminal via another resistor 410. A second input of the operational amplifier 406 may be coupled in a feedback arrangement to the second terminal of the transistor 408. Thus, the voltage reference generator 324 produces the threshold voltage, $V_{THRESH}$, across the resistor 326 based on the reference supply voltage, Vrs, received at the reference supply terminal 412. As described above, this arrangement may allow the boot comparator system to have good accuracy for the comparator threshold because the threshold value, $V_{THRESH}$, for the comparison can be generated using the internal (e.g., on-chip) reference supply voltage, Vrs. In some examples, the reference supply voltage, Vrs, is a bandgap voltage or other internally generated voltage.

Thus, aspects and embodiments provide a boot comparator system 200 that can accurately monitor the boot voltage, $V_{BOOT}$, relative to the switching voltage, $V_{SW}$, and operate robustly even in the presence of potentially significant and otherwise disruptive switching noise. Furthermore, examples of the boot comparator system 200 may occupy significantly less die area than circuitry that uses level shifters to convert from the high-side domain to a low-voltage domain, and consume less quiescent current, thus providing a more efficient solution that also delivers good performance.

FURTHER EXAMPLES

Example 1 is a circuit comprising: a comparator having a first comparator input, a second comparator input, and a comparator output, the comparator coupled to a supply terminal; a first transistor coupled between a boot terminal and the first comparator input, and having a control terminal coupled to a switching terminal; a second transistor coupled between the boot terminal and the second comparator input, and having a control terminal coupled to the switching terminal; a third transistor coupled between the supply terminal and the second comparator input; and a voltage reference generator coupled to the supply terminal and to a control terminal of the third transistor.

Example 2 includes the circuit of Example 1, wherein the first, second, and third transistors are drain extended p-channel field effect transistors.

Example 3 includes the circuit of one of Examples 1 or 2, further comprising: a first resistor coupled between the boot terminal and the first transistor, the first resistor having a first resistance value; a second resistor coupled between the boot terminal and the second transistor, wherein the second resistor has a second resistance value that is substantially N times the first resistance value, wherein N is a positive value; and a third resistor coupled between the supply terminal and the third transistor, the third resistor having substantially the first resistance value.

Example 4 includes the circuit of Example, 3, further comprising a fourth resistor coupled between the first transistor and a ground terminal, and a fifth resistor coupled between the second comparator input and the ground terminal, the fifth resistor having a substantially same resistance value as the fourth resistor.

Example 5 includes the circuit of Example 4, further comprising a first capacitor coupled in parallel with the fourth resistor, and a second capacitor coupled in parallel with the fifth resistor, the second capacitor having a substantially same capacitance value as the first capacitor.

Example 6 includes the circuit of Example 3, further comprising a fourth resistor coupled between the supply terminal and the control terminal of the third transistor.

Example 7 includes the circuit of Example 6, wherein the voltage reference generator is configured to generate a threshold voltage across the fourth resistor, and wherein the comparator is configured to provide an output signal at the comparator output, the output signal transitioning from a first value to a second value responsive to a difference between a boot voltage at the boot terminal and a switching voltage at the switching terminal transgressing the threshold voltage.

Example 8 includes the circuit of any one of Examples 3-7, further comprising a capacitor coupled between the boot terminal and the switching terminal.

Example 9 is a DC-DC power converter comprising the circuit of any one of Examples 1-8.

Example 10 is a circuit comprising: a comparator having a first comparator input, a second comparator input, and a comparator output, the comparator coupled to a supply terminal; first circuitry coupled to a boot terminal and to a switching terminal, the first circuitry configured to produce, at the first comparator input, a first voltage signal proportional to a difference between a boot voltage at the boot terminal and a switching voltage at the switching terminal, the first voltage signal including a first noise component; second circuitry coupled to the supply terminal and configured to produce, at the second comparator input, a second voltage signal; and noise cancellation circuitry coupled to the boot terminal, the switching terminal, and the second circuitry, the noise cancellation circuitry configured to introduce into the second voltage signal a second noise component substantially matching the first noise component, wherein the comparator is configured to produce, at the comparator output, an output signal that transitions from a first value to a second value responsive to the first voltage signal transgressing a threshold value based on the second voltage signal.

Example 11 includes the circuit of Example 10, wherein the first circuitry comprises a first resistor coupled between the first comparator input and a ground terminal, and wherein the first circuitry is configured to convert a voltage difference between the boot voltage and switching voltage to a current that flows through the first resistor to produce the first voltage signal, and wherein the second circuitry comprises a second resistor coupled between the second comparator input and the ground terminal, the second resistor having a substantially same resistance value as the first resistor.

Example 12 includes the circuit of Example 11, wherein the second circuitry comprises a voltage reference generator coupled to the supply terminal and configured to produce a threshold voltage having the threshold value; and wherein the second voltage signal is based on the threshold voltage.

Example 13 includes the circuit of Example 12, wherein the first circuitry further comprises a third resistor having a first resistor terminal and a second resistor terminal, the first resistor terminal coupled to the boot terminal, and a first transistor coupled between the second resistor terminal and the first comparator input, and having a control terminal coupled to the switching terminal.

Example 14 includes the circuit of Example 13, wherein the second circuitry further comprises a fourth resistor having a third resistor terminal and a fourth resistor terminal, the third resistor terminal coupled to the supply terminal, the fourth resistor having a substantially same resistance value as the third resistor, and a second transistor coupled between the fourth resistor terminal and the second comparator input, and having a control terminal coupled to the voltage reference generator.

Example 15 includes the circuit of Example 14, wherein the second circuitry comprises a fifth resistor coupled between the supply terminal and the control terminal of the second transistor; wherein the voltage reference generator is configured to produce the threshold voltage across the fifth resistor.

Example 16 includes the circuit of Example 14, wherein the noise cancellation circuitry comprises a fifth resistor having a fifth resistor terminal and a sixth resistor terminal, the fifth resistor terminal coupled to the boot terminal, the fifth resistor having a resistance value that is substantially N times a resistance value of the third resistor, wherein N is a positive value, and a third transistor coupled between the sixth resistor terminal and the second comparator input, and having a control terminal coupled to the switching terminal.

Example 17 includes the circuit of Example 16, wherein the first, second, and third transistors are drain extended p-channel field effect transistors.

Example 18 includes the circuit of any one of Examples 11-17, wherein the first circuitry comprises a first capacitor coupled in parallel with the first resistor, and wherein the second circuitry comprises a second capacitor coupled in parallel with the second resistor, the second capacitor having a substantially same capacitance value as the first capacitor.

Example 19 is a DC-DC converter comprising the circuit of any one of Examples 10-18.

Example 20 is a buck converter comprising a first transistor coupled between an input voltage terminal and a switching terminal, a second transistor coupled between the switching terminal and a ground terminal, a driver coupled to a boot terminal and the switching terminal, and having a driver output coupled to a control terminal of the first transistor, the driver configured to provide a drive signal at the control terminal of the first transistor, and a boot comparator system configured to monitor a boot voltage at the boot terminal. The boot comparator system includes a comparator having a first comparator input, a second comparator input, and a comparator output, the comparator coupled to a supply terminal, a third transistor coupled between the boot terminal and the first comparator input, and having a control terminal coupled to the switching terminal, a fourth transistor coupled between the boot terminal and the second comparator input, and having a control terminal coupled to the switching terminal, a fifth transistor coupled between the supply terminal and the second comparator input, and a voltage reference generator coupled to the supply terminal and to a control terminal of the fifth transistor.

Example 21 includes the buck converter of Example 20, wherein the third, fourth, and fifth transistors are drain extended p-channel field effect transistors; and wherein the first transistor is an n-channel field effect transistor.

Example 22 includes the buck converter of one of Examples 20 or 21, wherein the boot comparator system further comprises a first resistor coupled between the third transistor and a ground terminal, a second resistor coupled between the second comparator input and the ground terminal, the second resistor having a substantially same resistance value as the first resistor, and a third resistor coupled between the supply terminal and the control terminal of the fifth transistor.

Example 23 includes the buck converter of Example 22, wherein the voltage reference generator is configured to generate a threshold voltage across the third resistor, and wherein the comparator is configured to provide an output signal at the comparator output, the output signal transitioning from a first value to a second value responsive to a difference between the boot voltage and a switching voltage at the switching terminal transgressing the threshold voltage.

Example 24 is a buck converter comprising a first transistor coupled between an input voltage terminal and a switching terminal, a second transistor coupled between the switching terminal and a ground terminal, a driver coupled to a boot terminal and the switching terminal, and having a driver output coupled to a control terminal of the first transistor, the driver configured to provide a drive signal at the control terminal of the first transistor, and a boot comparator system configured to monitor a boot voltage at the boot terminal. The boot comparator system includes a comparator coupled to a supply terminal and having a first comparator input, a second comparator input, and a comparator output, first circuitry coupled to the boot terminal and to the switching terminal, the first circuitry configured to produce, at the first comparator input, a first voltage signal proportional to a difference between a boot voltage at the boot terminal and a switching voltage at the switching terminal, the first voltage signal including a first noise component, second circuitry coupled to the supply terminal and configured to produce, at the second comparator input, a second voltage signal, and noise cancellation circuitry coupled to the boot terminal, the switching terminal, and the second circuitry, the noise cancellation circuitry configured to introduce into the second voltage signal a second noise component substantially matching the first noise component, wherein the comparator is configured to produce, at the comparator output, an output signal that transitions from a first value to a second value responsive to the first voltage signal transgressing a threshold value based on the second voltage signal.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end user and/or a third party.

While the use of particular transistors is described herein, other transistors (or equivalent devices) may be used instead. For example, a p-channel field effect transistor (PFET) may be used in place of an n-channel field effect transistor (NFET) with little or no changes to the circuit. Furthermore, other types of transistors may be used (such as bipolar junction transistors (BJTs)). Furthermore, the devices may be implemented in/over a silicon substrate (Si), a silicon carbide substrate (SiC), a gallium nitride substrate (GaN) or a gallium arsenide substrate (GaAs). Moreover, reference to transistor features such as gate, source, or drain is not intended to exclude any suitable transistor technologies. For instance, features such as source, drain, and gate are typically used to refer to a FET, while emitter, collector, and base are typically used to refer to a BJT. Such features may be used interchangeably herein. For instance, reference to the gate of a transistor may refer to either the gate of a FET or the base of a BJT, and vice-versa. In some examples, a control terminal may refer to either the gate of a FET or the base of a BJT. Any other suitable transistor technologies can be used. Any such transistors can be used as a switch, with the gate or base or other comparable feature acting as a switch select input that can be driven to connect the source and drain (or the emitter and collector, as the case may be).

References herein to a field effect transistor (FET) being "ON" (or a switch being closed) means that the conduction channel of the FET is present, and drain current may flow through the FET. References herein to a FET being "OFF" (or a switch being open) means that the conduction channel is not present, and drain current does not flow through the FET. A FET that is OFF, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within a range of that parameter, such as +/−10 percent of that parameter or +/−5 percent of that parameter.

Modifications are possible in the described examples, and other examples are possible within the scope of the claims.

What is claimed is:

1. A circuit comprising:
a comparator having a first comparator input, a second comparator input, and a comparator output, the comparator coupled to a supply terminal;
a first transistor coupled between a boot terminal and the first comparator input, and having a control terminal coupled to a switching terminal;
a second transistor coupled between the boot terminal and the second comparator input, and having a control terminal coupled to the switching terminal;
a third transistor coupled between the supply terminal and the second comparator input; and
a voltage reference generator coupled to the supply terminal and to a control terminal of the third transistor.

2. The circuit of claim 1, wherein the first, second, and third transistors are drain extended p-channel field effect transistors.

3. The circuit of claim 1, further comprising:
a first resistor coupled between the boot terminal and the first transistor, the first resistor having a first resistance value;
a second resistor coupled between the boot terminal and the second transistor, wherein the second resistor has a second resistance value that is substantially N times the first resistance value, wherein N is a positive value; and
a third resistor coupled between the supply terminal and the third transistor, the third resistor having substantially the first resistance value.

4. The circuit of claim 3, further comprising:
a fourth resistor coupled between the first transistor and a ground terminal; and
a fifth resistor coupled between the second comparator input and the ground terminal, the fifth resistor having a substantially same resistance value as the fourth resistor.

5. The circuit of claim 3, further comprising:
a fourth resistor coupled between the supply terminal and the control terminal of the third transistor.

6. The circuit of claim 5, wherein the voltage reference generator is configured to generate a threshold voltage across the fourth resistor; and
wherein the comparator is configured to provide an output signal at the comparator output, the output signal transitioning from a first value to a second value responsive to a difference between a boot voltage at the boot terminal and a switching voltage at the switching terminal transgressing the threshold voltage.

7. The circuit of claim 3, further comprising:
a capacitor coupled between the boot terminal and the switching terminal.

8. A circuit comprising:
a comparator having a first comparator input, a second comparator input, and a comparator output, the comparator coupled to a supply terminal;

first circuitry coupled to a boot terminal and to a switching terminal, the first circuitry configured to produce, at the first comparator input, a first voltage signal proportional to a difference between a boot voltage at the boot terminal and a switching voltage at the switching terminal, the first voltage signal including a first noise component;
second circuitry coupled to the supply terminal and configured to produce, at the second comparator input, a second voltage signal; and
noise cancellation circuitry coupled to the boot terminal, the switching terminal, and the second circuitry, the noise cancellation circuitry configured to introduce into the second voltage signal a second noise component substantially matching the first noise component;
wherein the comparator is configured to produce, at the comparator output, an output signal that transitions from a first value to a second value responsive to the first voltage signal transgressing a threshold value based on the second voltage signal.

9. The circuit of claim 8, wherein the first circuitry comprises a first resistor coupled between the first comparator input and a ground terminal, and wherein the first circuitry is configured to convert a voltage difference between the boot voltage and switching voltage to a current that flows through the first resistor to produce the first voltage signal;
wherein the second circuitry comprises a second resistor coupled between the second comparator input and the ground terminal, the second resistor having a substantially same resistance value as the first resistor.

10. The circuit of claim 9, wherein the second circuitry comprises a voltage reference generator coupled to the supply terminal and configured to produce a threshold voltage having the threshold value; and wherein the second voltage signal is based on the threshold voltage.

11. The circuit of claim 10, wherein the first circuitry further comprises:
a third resistor having a first resistor terminal and a second resistor terminal, the first resistor terminal coupled to the boot terminal; and
a first transistor coupled between the second resistor terminal and the first comparator input, and having a control terminal coupled to the switching terminal.

12. The circuit of claim 11, wherein the second circuitry further comprises:
a fourth resistor having a third resistor terminal and a fourth resistor terminal, the third resistor terminal coupled to the supply terminal, the fourth resistor having a substantially same resistance value as the third resistor; and
a second transistor coupled between the fourth resistor terminal and the second comparator input, and having a control terminal coupled to the voltage reference generator.

13. The circuit of claim 12, wherein the second circuitry comprises a fifth resistor coupled between the supply terminal and the control terminal of the second transistor; wherein the voltage reference generator is configured to produce the threshold voltage across the fifth resistor.

14. The circuit of claim 12, wherein the noise cancellation circuitry comprises:
a fifth resistor having a fifth resistor terminal and a sixth resistor terminal, the fifth resistor terminal coupled to the boot terminal, the fifth resistor having a resistance value that is substantially N times a resistance value of the third resistor, wherein N is a positive value; and a third transistor coupled between the sixth resistor terminal and the second comparator input, and having a control terminal coupled to the switching terminal.

15. The circuit of claim 14, wherein the first, second, and third transistors are drain extended p-channel field effect transistors.

16. The circuit of claim 9, wherein the first circuitry comprises a first capacitor coupled in parallel with the first resistor; and wherein the second circuitry comprises a second capacitor coupled in parallel with the second resistor, the second capacitor having a substantially same capacitance value as the first capacitor.

17. A buck converter comprising:

a first transistor coupled between an input voltage terminal and a switching terminal;

a second transistor coupled between the switching terminal and a ground terminal;

a driver coupled to a boot terminal and the switching terminal, and having a driver output coupled to a control terminal of the first transistor, the driver configured to provide a drive signal at the control terminal of the first transistor; and a boot comparator system configured to monitor a boot voltage at the boot terminal, the boot comparator system including a comparator having a first comparator input, a second comparator input, and a comparator output, the comparator coupled to a supply terminal, a third transistor coupled between the boot terminal and the first comparator input, and having a control terminal coupled to the switching terminal, a fourth transistor coupled between the boot terminal and the second comparator input, and having a control terminal coupled to the switching terminal, a fifth transistor coupled between the supply terminal and the second comparator input, and a voltage reference generator coupled to the supply terminal and to a control terminal of the fifth transistor.

18. The buck converter of claim 17, wherein the third, fourth, and fifth transistors are drain extended p-channel field effect transistors; and wherein the first transistor is an n-channel field effect transistor.

19. The buck converter of claim 17, wherein the boot comparator system further comprises:

a first resistor coupled between the third transistor and a ground terminal;

a second resistor coupled between the second comparator input and the ground terminal, the second resistor having a substantially same resistance value as the first resistor; and a third resistor coupled between the supply terminal and the control terminal of the fifth transistor.

20. The buck converter of claim 19, wherein the voltage reference generator is configured to generate a threshold voltage across the third resistor; and wherein the comparator is configured to provide an output signal at the comparator output, the output signal transitioning from a first value to a second value responsive to a difference between the boot voltage and a switching voltage at the switching terminal transgressing the threshold voltage.

* * * * *